US012686912B2

(12) United States Patent (10) Patent No.: US 12,686,912 B2
Stollenwerk et al. (45) Date of Patent: Jul. 21, 2026

(54) THIN METAL FILMS HAVING AN ULTRA-FLAT SURFACE AND METHODS OF PREPARING THE SAME

(71) Applicant: University of Northern Iowa Research Foundation, Cedar Falls, IA (US)

(72) Inventors: Andrew Stollenwerk, Cedar Falls, IA (US); Timothy Kidd, Cedar Falls, IA (US)

(73) Assignee: University of Northern Iowa Research Foundation, Cedar Falls, IA (US)

( * ) Notice: Subject to any disclaimer, the term of this patent is extended or adjusted under 35 U.S.C. 154(b) by 267 days.

(21) Appl. No.: 18/184,423

(22) Filed: Mar. 15, 2023

(65) Prior Publication Data

US 2023/0235444 A1 Jul. 27, 2023

Related U.S. Application Data

(63) Continuation of application No. PCT/US2021/050459, filed on Sep. 15, 2021.

(60) Provisional application No. 63/078,712, filed on Sep. 15, 2020.

(51) Int. Cl.
| | |
|---|---|
| *C23C 14/18* | (2006.01) |
| *C23C 14/00* | (2006.01) |
| *C23C 14/30* | (2006.01) |
| *C23C 14/34* | (2006.01) |
| *C23C 14/58* | (2006.01) |

(52) U.S. Cl.
CPC ........ *C23C 14/185* (2013.01); *C23C 14/0005* (2013.01); *C23C 14/30* (2013.01); *C23C 14/34* (2013.01); *C23C 14/5806* (2013.01)

(58) Field of Classification Search
CPC ....... C23C 14/14; C23C 14/16; C23C 14/165; C23C 14/18; C23C 14/185; C23C 16/06; C23C 16/08; C23C 16/16; C23C 16/18; C23C 16/20
See application file for complete search history.

(56) References Cited

U.S. PATENT DOCUMENTS

| | | | |
|---|---|---|---|
| 6,022,801 | A | 2/2000 | Domenicucci et al. |
| 8,398,872 | B2 | 3/2013 | El Gabaly et al. |
| 2007/0131873 | A1 | 6/2007 | Allred Jr. et al. |

(Continued)

FOREIGN PATENT DOCUMENTS

| | | | | | |
|---|---|---|---|---|---|
| WO | WO-2019132714 | A1 | * | 7/2019 | ............. C23C 14/14 |
| WO | WO-2022013111 | A1 | * | 1/2022 | ............. C30B 29/02 |

OTHER PUBLICATIONS

Chabal et al., "Metal Contacts on Physical Vapor Deposited Monolayer MoS2", ACS Nano, vol. 7, #12, pp. 11350-11357; 10.1021/nn4052138 (Year: 2013).*

(Continued)

*Primary Examiner* — Z. Jim Yang

(74) *Attorney, Agent, or Firm* — McKee, Voorhees & Sease, PLC

(57) ABSTRACT

The present disclosure relates generally to thin metal films having an ultra-flat surface and methods of their preparation. In particular, the ultra-flat thin metal films comprise FCC metals. Preferably, the thin metal films are attached to a substrate. Preferred substrates comprise chalcogenides and dichalcogenides. Beneficially, the thin metal films described herein can be prepared at ambient temperatures.

7 Claims, 8 Drawing Sheets

(56)                References Cited

U.S. PATENT DOCUMENTS

2014/0272335 A1*  9/2014  Hassan ............... C03C 17/3644
                                                              117/106
2016/0333459 A1   11/2016  Thuo et al.
2017/0200526 A1*   7/2017  Guo ...................... H10F 71/138
2021/0071292 A1*   3/2021  Rodionov ............. C30B 23/063

OTHER PUBLICATIONS

Yakubovsky et al., "Ultrathin and Ultrasmooth Gold Films on Monolayer MoS2", Adv. Mater. Interfaces, 2019, 6, 1900196. DOI: 10.1002/admi.201900196.*

Mironov et al., "Ultrathin and Ultrasmooth Gold Films on van der Waals Materials", Bulletin of the Russian Academy of Sciences: Physics, 2023, vol. 87, Suppl. 3, pp. S416-S420. DOI: 10.1134/S1062873823705962.*

Zhang et al., "Highly conductive nanometer-thick gold films grown on molybdenum disulfide surfaces for interconnect applications", Scientific Reports, 2020. DOI: 10.1038/s41598-020-71520-x.*

Chen et al., "Van der Waals Epitaxy of Large-Area and Single-Crystalline Gold Films on MoS2 for Low-Contact-Resistance 2D-3D Interfaces", Applied Nano Materials, 2020, vol. 3, pp. 2997-3003, 7 pages.

Cooley et al., "Room-temperature epitaxy of metal thin films on tungsten diselenide", Journal of Crystal Growth, 2019, vol. 505, pp. 44-51, 8 pages total.

Domask et al., "Room Temperature van der Waals Epitaxy of Metal Thin Films on Molybdenum Disulfide", Crystal Growth & Design, 2018, vol. 18, pp. 3494-3501, 8 pages.

Espinosa et al., "Direct fabrication of thin layer MoS2 field-effect nanoscale transistors by oxidation scanning probe lithography", Applied Phyiscs Letters, 2015, vol. 106, No. 10, pp. 103503-1-103503-4.

International Search Report and Written Opinion in PCT/US2021/050459, mailed Jan. 10, 2022, 27 pages.

Jia et al., "Clarification of surface modes of a periodic nanopatch metasurface", Optics Express 3004, Feb. 5, 2018, vol. 26, No. 3, 9 pages.

Kidd et al., "Self-assembled Ag(111) nanostructures induced by Fermi surface nesting", Physical Review B, 2019, vol. 100, No. 23, pp. 235447-1-235447-5.

Kidd et al., "Three-dimensional quantum size effects on the growth of Au islands on MoS2", Applied Physics Letters, 2018, vol. 113, No. 19, po. 191603-1-191603-4.

Lee et al., "Construction of RNA-Quantum Dot Chimera for Nanoscale Resistive Biomemory Application", ACS Nano., Jul. 2, 2015, vol. 9, No. 7, pp. 6675-6682.

Wang et al., "Electronic Supporting Information: Detection of electron tunneling across plasmonic nanoparticle-film unctions using nitrile vibrations", Physical Chemistry Chemical Physics, 2017, vol. 19, No. 8, 19 pages.

Written Opinion of the International Preliminary Examining Authority in PCT/US2021/050459, mailed Aug. 16, 2022, 20 pages.

Yakubovsky et al., "Supporting Information: Ultrathin and Ultrasmooth Gold Films on Monolayer MoS2", Advanced Materials Interfaces, 2019, vol. 6, No. 1900196, 12 pages.

Yakubovsky et al., "Ultrathin and Ultrasmooth Gold Films on Monolayer MoS2", Advanced Materials Interfaces, 2019, vol. 6, No. 1900196, pp. 1-6.

Zhang et al., "Highly conductive nanometer-thick gold films grown on molybdenum disulfide surfaces for interconnect applications", Scientific Reports, 2020, vol. 10, No. 14463, pp. 1-6.

* cited by examiner

THIN METAL FILMS HAVING AN ULTRA-FLAT SURFACE AND METHODS OF PREPARING THE SAME

CROSS REFERENCE TO RELATED APPLICATIONS

This is a By-Pass Continuation of PCT/US2021/050459, filed Sep. 15, 2021, which application is related to and claims priority under 35 U.S.C. § 119 to U.S. Provisional Application Ser. No. 63/078,712 filed on Sep. 15, 2020, entitled "THIN METAL FILMS HAVING AN ULTRA-FLAT SURFACE AND METHODS OF PREPARING THE SAME." The entire contents of this patent application are hereby expressly incorporated herein by reference including, without limitation, the specification, tables, examples, claims, and abstract.

GRANT REFERENCE

Work for this invention was funded in part by grants from National Science Foundation, Grant No. DMR-1410496. The United States government may have certain rights in this invention.

TECHNICAL FIELD

The present technology relates generally to ultra-flat thin metal films and methods of their preparation. In particular, the ultra-flat thin metal films comprise FCC metals.

BACKGROUND

Ultra-flat thin metal films are of increased demand, particularly, within the electronics industry where small and thin devices and materials are sought. Despite some advances in materials and techniques, there are still many problems with existing methods of preparing thin metal films. Existing technology for producing flat metal films falls into two categories: 1) standard flat metal films having an RMS surface roughness of about 17.3 Å and, 2) ultra-flat metal films having an RMS surface roughness of about 3.6 Å. In preparing flat metal films, one of the differences between standard flat and ultra-flat metal films is the underlying substrate used in the production process. Thin metal films having a standard flat surface are often created when the metal is coated on a silicon wafer base. Thin metal films having an ultra-flat surface often utilize a foundation of mica which contributes to the flatter surface.

Both standard flat surfaces and existing ultra-flat surfaces suffer from deficiencies. For example, standard flat surfaces do not have the desired surface flatness and often suffer from other surface deformities. Existing ultra-flat surfaces, such as those deposited on mica or silicon dioxide, have lateral extents and grains that are smaller than desired.

Some flat surfaces have been further limited by their methods of preparation, requiring cryogenic temperatures. This manufacturing requirement increases the costs of manufacturing and/or limits the ability for manufacturers to incorporate thin-film preparation into traditional electronics manufacturing processes.

Accordingly, there is a need for improved methods of manufacturing thin film metals with flat surfaces. Further, there is need for improved ultra-flat thin metal films.

Other objects, advantages and features of the present invention will become apparent from the following specification taken in conjunction with the accompanying figures.

Figure 1:
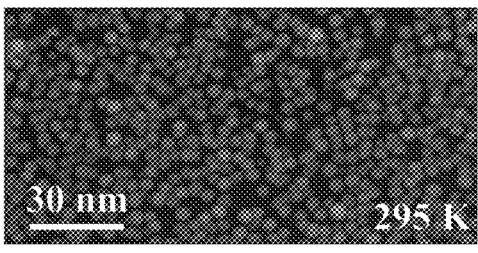
FIG. 1 is a scanning tunneling microscopy image of Ag(111) islands on $MoS_2$ with a 0.7 nm nominal coverage before annealing. This figure shares the same scale bar as FIG. 2.

Various embodiments of the present inventions will be described in detail with reference to the figures. Reference to various embodiments does not limit the scope of the invention. Figures represented herein are not limitations to the various embodiments according to the invention and are presented for exemplary illustration of the invention.

DETAILED DESCRIPTION OF THE PREFERRED EMBODIMENT

In the following detailed description, reference is made to the accompanying figures, which form a part hereof. In the illustrative embodiments described in the detailed description, figures, and claims are not meant to be limiting. Other embodiments may be utilized, and other changes may be made, without departing from the spirit or scope of the subject matter presented here.

The present disclosure relates to ultra-flat thin metal films and methods of preparing the same. The ultra-flat thin metal films have many advantages over standard flat and ultra-flat thin films, including but not limited to, reduced surface roughness in comparison with many ultra-flat films, reduced surface defects, and increased lateral extents. The methods of preparing ultra-flat thin metal films disclosed herein have advantages over existing methods. For example, the methods described herein are not limited to cryogenic temperatures and can be performed at ambient temperatures.

The embodiments of this invention are not limited to particular applications thin metal films and ultra-flat surfaces, which can vary and are understood by skilled artisans. It is further to be understood that all terminology used herein is for the purpose of describing particular embodiments only, and is not intended to be limiting in any manner or scope. For example, as used in this specification and the appended claims, the singular forms "a," "an" and "the" can include plural referents unless the content clearly indicates otherwise. Further, all units, prefixes, and symbols may be denoted in the SI accepted form.

Numeric ranges recited within the specification are inclusive of the numbers defining the range and include each integer within the defined range. Throughout this disclosure, various aspects of this invention are presented in a range format. It should be understood that the description in range format is merely for convenience and brevity and should not be construed as an inflexible limitation on the scope of the invention. Accordingly, the description of a range should be considered to have specifically disclosed all the possible sub-ranges, fractions, and individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6, and decimals and fractions, for example, 1.2, 3.8, 1½, and 4¾ This applies regardless of the breadth of the range.

References to elements herein are intended to encompass any or all of their oxidative states and isotopes. For example, if silver is discussed, such can include $Ag^{I}$, $Ag^{II}$, and $Ag^{III}$ and $^{93}Ag$, $^{94}Ag$, $^{95}Ag$, $^{96}Ag$, $^{97}Ag$, $^{98}Ag$, $^{99}Ag$, $^{100}Ag$ $^{101}Ag$, $^{102}Ag$, $^{103}Ag$, $^{104}Ag$, $^{105}Ag$, $^{106}Ag$, $^{107}Ag$, $^{108}Ag$, $^{109}Ag$, $^{110}Ag$, $^{111}Ag$, $^{112}Ag$, $^{113}Ag$, $^{114}Ag$, $^{115}Ag$, $^{116}Ag$, $^{117}Ag$, $^{118}Ag$, $^{119}Ag$, $^{120}Ag$, $^{122}Ag$, $^{123}Ag$, $^{124}Ag$, $^{125}Ag$, $^{126}Ag$, $^{127}Ag$, $^{128}Ag$, $^{129}Ag$, $^{130}Ag$, $^{131}Ag$, and $^{132}Ag$ unless otherwise stated.

Definitions

So that the present invention may be more readily understood, certain terms are first defined. Unless defined otherwise, all technical and scientific terms used herein have the same meaning as commonly understood by one of ordinary skill in the art to which embodiments of the invention pertain. Many methods and materials similar, modified, or equivalent to those described herein can be used in the practice of the embodiments of the present invention without undue experimentation, the preferred materials and methods are described herein. In describing and claiming the embodiments of the present invention, the following terminology will be used in accordance with the definitions set out below.

The term "about," as used herein, refers to variation in the numerical quantity that can occur, for example, through typical measuring techniques and equipment, with respect to any quantifiable variable, including, but not limited to, mass, volume, time, length, height, width, roughness, and distance. Further, given solid and liquid handling procedures used in the real world, there is certain inadvertent error and variation that is likely through differences in the manufacture, source, or purity of the ingredients used to make the compositions or carry out the methods and the like. Whether or not modified by the term "about," the claims include equivalents to the quantities.

The methods and compositions of the present invention may comprise, consist essentially of, or consist of the components and ingredients of the present invention as well as other ingredients described herein. As used herein, "consisting essentially of" means that the methods, systems, apparatuses and compositions may include additional steps, components or ingredients, but only if the additional steps, components or ingredients do not materially alter the basic and novel characteristics of the claimed methods and compositions.

The term "RMS" refers to the root mean square and is used in the context of surface roughness.

The term "weight percent," "wt. %," "wt-%," "percent by weight," "% by weight," and variations thereof, as used herein, refer to the concentration of a substance as the weight of that substance divided by the total weight of the composition and multiplied by 100.

Ultra-Flat Thin Metal Films

The compositions as described herein comprise thin metal films having an ultra-flat surface. In a preferred embodiment, the thin metal films are attached to a substrate.

The thin metal film is formed on a substrate, such that the substrate and thin metal film are attached at an interface. In an aspect of the compositions, the thin metal film has opposing sides—one side forming the interface attached to the substrate, the other side is opposite the interface forms a flat surface. Preferably the flat surface is an ultra-flat surface. The flat surface preferably has a surface roughness of less than about 250 pm, more preferably less than about 200 pm, still more preferably less than about 150 pm, even more preferably less than about 100 pm, and most preferably equal to or less than about 50 pm.

In preparation of thin films, lattice matching between the substrate and material to be deposited (in this instance FCC metals) is often sought. Surprisingly we have found that the typical degree of lattice matching is not required. For example, in preferred embodiments disclosed herein, there can be a lattice mismatch of at least about 5%, 6%, 7%, 8%, 9%, 10%, 11%, 12%, 13%, 14%, 15%, 16%, 17%, 18%, 19%, or 20% between the substrate and the FCC metal. It is believed that the findings described further below related to electronic properties contribute to formation of the ultra-flat surface, whereas in traditional techniques, lattice matching is pursued.

Beneficially, the thin metal films disclosed herein, can have a large lateral surface area. Existing methods of preparing thin metal films are limited as to the lateral surface area. Techniques that permit the preparation of larger surface areas typically suffer from surface deformities such that the surfaces cannot be considered ultra-flat. The methods disclosed herein overcome these prior limitations by providing for the formation of thin metal films having large lateral surface areas that are ultra-flat. For example, the flat surface of the thin metal film preferably has a lateral surface area of at least about 1 square micron, more preferably at least about 5 square microns, still more preferably at least about 10 square microns, even more preferably at least about 20 square microns, most preferably at least about 50 square microns.

In an embodiment, the thin metal film can be separated from the substrate at the interface after the film is prepared such that the metal can be added to another substrate. Any suitable mechanism for separating the thin metal film from the substrate can be employed including, but not limited to, peeling or etching.

In an embodiment, the thin metal film can be retained on the substrate and the substrate can serve as a buffer layer between the thin metal film and a second substrate, such as silicon. The inventions described herein are not limited by the second substrate.

In an embodiment, the thin metal film can be retained on the substrate and this combined system can then serve as a substrate for further film deposition or other deposition of material. The inventions described herein are not limited by the deposition of additional material.

In a preferred embodiment, the thin metal films can be a template for electronic materials or as a coating. In a most preferred embodiment, the thin metal film is a reflective coating material.

Metals

The thin metal films comprise a metal. Preferred metals are FCC metals including, silver (Ag), gold (Au), copper (Cu), aluminum (Al), iridium (Ir), lead (Pb), nickel (Ni), and mixtures or combinations thereof. In an aspect of the present disclosure, the metals are deposited on a substrate to form a thin film, that the thin metal film having a surface that is ultra-flat. The thickness of the thin metal film can vary by the metal being deposited and also based on end use as a certain minimum thickness may be desired for certain applications. Surprisingly, we have found that in depositing the metal to form a thin film on a substrate, there is a minimum thickness at which point the surface roughness is significantly reduced as the metal molecules shift in a manner to form a smooth layer with minimal peaks and divots. While not wishing to be bound by the theory, it is believed that this is due to the electronic properties of the metal. When the thickness of the metal film matches the Fermi wavelength, the energy of the system decreases as a gap opens in the band structure at the Fermi surface. This results in conditions optimal for the metal atoms to configure in a manner to achieve the ultra-flat surface. Further, while not wishing to be bound by the theory it is believed that Van der Waals forces are critical to the formation of the ultra-flat surface as the weak coupling permits the atoms to rearrange at the interface and achieve the ultra-flat surface.

The ultra-flat, thin metal film has a minimum thickness that depends on the interface properties between the metal and the substrate. Preferably, the thin metal film has a minimum thickness between about 2 nm and about 10 nm, more preferably between about 2.5 nm and about 8 nm. In the case of gold on $MoS_2$, the minimum thickness of at least about 7.0 nm. In a preferred embodiment, the thin metal film is gold and has a thickness of at least about 7.0 nm and up to at least 20 nm, but possibly hundreds of nanometers.

Substrates

Preferably the substrate comprises a chalcogen. Chalcogens include oxygen (O), sulfur (S), selenium (Se), tellurium (Te), and polonium (Po). Preferred chalcogens include, but are not limited to, sulfur, selenium, and tellurium. Preferred substrates include, but are not limited to, chalcogenides (MX and $M_2X_3$) and dichalcogenides ($MX_2$), where M is a metal and X is a chalcogen. Suitable metals include, but are not limited to, boron, aluminum, zinc, gallium, indium, thallium, tin, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, and gold. Preferably, the metal (M) is a transition metal. In a most preferred embodiment, the substrate is comprised of the form $MX_2$, where M is Ti, V, Zr, Nb, Mo, Pt, Sn, Hf, Ta, W and X is S, Se, or Te. The most preferred substrate could also include mixtures of the metal (e.g., $Ti_{0.25}Zr_{0.75}S_2$), of the chalcogen (e.g., $TiS_{1.5}Se_{0.5}$) or both (e.g., $Ti_{0.25}Ta_{0.75}Ste$). The most preferred substrate can also include additional inclusions in which metal ions, organic ions, or other elements or molecules are incorporated between the layers of the dichalcogenide.

One embodiment is for the substrate to be in the form of a layered crystal. This could be a single crystal or a crystal with a granular structure, preferably a highly oriented granular structure. The crystal could be thick, with thicknesses measuring as small as 1 micron or including thicknesses exceeding several millimeters.

One embodiment is for the substrate to be very thin, with thicknesses ranging from a single molecule to 100 microns, but preferably between a single molecule and 100 nm. Thin substrates can be formed by several different mechanisms, including but not limited to physical peeling or exfoliation of a larger crystal or deposition of the substrate as a film onto a primary substrate. Chalcogenides and dichalcogenides can be deposited as films via a variety of methods. The chalcogenide film substrates can be prepared according to any appropriate deposition techniques. Appropriate deposition techniques include those performed under vacuum conditions. In a preferred embodiment, the vacuum conditions are between pressures of about 9×10-11 torr and about 10-3 15 torr. Preferred deposition techniques include, but are not limited to laser ablation, chemical vapor deposition, physical vapor deposition, molecular beam epitaxy, and electroplating. Physical vapor deposition techniques including, but not limited to, sputtering and vacuum evaporation.

In an embodiment where the substrate serves as a buffer layer between the thin metal film and a second, primary, substrate, it is preferable that the substrate having an interface with the thin metal film be conductive or semiconductive. The primary underlying substrate can be of any material suitable for a particular application.

Methods of Preparing the Thin Metal Films

The thin metal films can be prepared according to any appropriate deposition techniques. Appropriate deposition techniques include those performed under vacuum conditions. In a preferred embodiment, the vacuum conditions are between pressures of about $9\times10^{-11}$ torr and about $10^{-3}$ torr. Preferred deposition techniques include, but are not limited to laser ablation, chemical vapor deposition, physical vapor deposition, molecular beam epitaxy, and electroplating.

Physical vapor deposition techniques including, but not limited to, sputtering and vacuum evaporation.

The thin metal films can be prepared at cryogenic, ambient, or elevated temperatures. This is an improvement over existing manufacturing processes, which require cryogenic temperatures. While the methods described herein can be performed at cryogenic temperatures and temperatures below 0° C., it is an advantage of the methods described herein that cold temperature preparation is not required. Thus, in a preferred embodiment, the deposition is performed at a temperature of at least about 0° C., more preferably of at least about 10° C., still more preferably at least about 15° C., most preferably between about 18° C. and about 35° C. The films can also be prepared at elevated temperatures if desired so as to be compatible with standard electronic manufacturing processes. The upper limit for deposition depends on the particulars of the substrate and metal, but normally no more than 1,000° C.

After depositing the metal on the substrate under cryogenic or ambient, the composition is preferably annealed. The annealing is preferably performed for a time between about 1 minute and about 24 hours, more preferably between about 5 minutes and about 30 minutes, most preferably between about 10 minutes and about 20 minutes. The annealing temperature can be selected based on the substrate and metal. In a preferred embodiment, the annealing is performed at a temperature of about 650 K, but could range from the deposition temperature through 1,000° C. depending strongly on the material system.

Exemplary preferred embodiments are further defined in the following numbered paragraphs.

1. A thin film composition comprising:
a substrate and a metal, wherein the metal has a first side and a second side, wherein the first side is attached to the substrate forming an interface, wherein the interface is opposed to the second side, and wherein the second side is a flat surface;
wherein the substrate comprises a chalcogenide or a dichalcogenide; and
wherein the metal comprises an FCC metal.

2. The thin film composition of paragraph 1, wherein the FCC metal comprises silver, gold, copper, aluminum, iridium, lead, nickel, or a combination or mixture thereof.

3. The thin film composition of paragraph 1 or 2, wherein the substrate is a chalcogenide having the formula:

$$MX \text{ or } M_2X_3$$

wherein X comprises oxygen, sulfur, selenium, tellurium, or polonium; and wherein M comprises boron, aluminum, zinc, gallium, indium, thallium, tin, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, and gold.

4. The thin film composition of paragraph 3, wherein X comprises sulfur, selenium, or tellurium.

5. The thin film composition of paragraph 1 or 2, wherein the substrate is a dichalcogenide having the formula:

$$MX_2$$

wherein X comprises oxygen, sulfur, selenium, tellurium, or polonium; and wherein M comprises boron, aluminum, zinc, gallium, indium, thallium, tin, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, and gold.

6. The thin film composition of paragraph 5, wherein the dichalcogenide is $MoS_2$, $WS_2$, $MoSe_2$, $WSe_2$, or $MoTe_2$.

7. The thin film composite of any one of paragraphs 1-6, wherein the FCC metal comprises silver, gold, or a combination or mixture thereof.

8. The thin film composition of any one of paragraphs 1-7, wherein the ultra-flat surface has a surface roughness of less than about 250 pm.

9. The thin film composition of any one of paragraphs 1-8, wherein the FCC metal has a thickness of at least about 2 nm.

10. The thin film composition of any one of paragraphs 1-9, wherein the FCC metal is gold and has a thickness of at least about 7.0 nm.

11. The thin film composition of any one of paragraphs 1-10, wherein the FCC metal has a thickness between 7.0 nm and up to about 200 nm.

12. The thin film composition of any one of paragraphs 1-11, wherein the ultra-flat surface has a surface roughness of less than about 100 pm.

13. The thin film composition of any one of paragraphs 1-12, wherein is the ultra-flat surface is a reflective coating.

14. The thin film composition of any one of paragraphs 1-13, wherein the ultra-flat surface has a surface roughness of less than about 100 pm.

15. The thin film composition of any one of paragraphs 1-14, wherein the substrate and the FCC metal have a lattice mismatch of at least about 5%.

16. A method of preparing a thin metal film comprising:
(a) depositing an FCC metal on a substrate to form a thin metal film;
wherein the depositing step is performed under vacuum conditions and at a temperature of at least about 0° C.

17. The method of paragraph 16, wherein the depositing step is performed by vacuum evaporation, sputtering, laser ablation, chemical vapor deposition, molecular beam epitaxy, or electroplating.

18. The method of paragraph 16 or 17, further comprising (b) annealing the thin metal film.

19. The method of paragraph 18, wherein the annealing is performed for a time between about 1 minute and about 20 hours.

20. The method of paragraph 18 or 19, wherein the annealing is performed at a temperature up to about 1000° C.

21. The method of any one of paragraphs 16-20, further comprising (c) separating the metal from the substrate.

22. The method of any one of paragraphs 16-21, wherein the FCC metal comprises silver, gold, copper, aluminum, iridium, lead, nickel, or a combination or mixture thereof.

23. The method of any one of paragraphs 16-22, wherein the substrate is a chalcogenide having the formula:

$$MX \text{ or } M_2X_3,$$

or a dichalcogenide having the formula:

$$MX_2$$

wherein X comprises oxygen, sulfur, selenium, tellurium, or polonium; and wherein M comprises boron, aluminum, zinc, gallium, indium, thallium, tin, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, and gold.

24. The method of paragraph 23, wherein X comprises sulfur, selenium, or tellurium.

25. The method of paragraph 23 or 24, wherein the dichalcogenide is $MoS_2$, $WS_2$, $MoSe_2$, $WSe_2$, or $MoTe_2$.

26. The method of any one of paragraphs 16-25, wherein the FCC metal comprises silver, gold, or a combination or mixture thereof.

27. The method of any one of paragraphs 16-26, wherein the ultra-flat surface has a surface roughness of less than about 250 pm.

28. The method of any one of paragraphs 16-27, wherein the FCC metal has a thickness of at least about 2 nm.

29. The method of any one of paragraphs 16-28, wherein the FCC metal is gold and has a thickness of at least about 7.0 nm.

30. The method of any one of paragraphs 16-29, wherein the FCC metal has a thickness between 7.0 nm and about 100 nm.

31. The method of any one of paragraphs 16-30, wherein the thin metal film is a reflective coating.

32. The method of any one of paragraphs 16-31, wherein the ultra-flat surface has a surface roughness of less than about 100 pm.

33. The method of any one of paragraphs 16-32, wherein the substrate and the FCC metal have a lattice mismatch of at least about 5%.

EXAMPLES

Embodiments of the present invention are further defined in the following non-limiting Examples. It should be understood that these Examples, while indicating certain embodiments of the invention, are given by way of illustration only. From the above discussion and these Examples, one skilled in the art can ascertain the essential characteristics of this invention, and without departing from the spirit and scope thereof, can make various changes and modifications of the embodiments of the invention to adapt it to various usages and conditions. Thus, various modifications of the embodiments of the invention, in addition to those shown and described herein, will be apparent to those skilled in the art from the foregoing description. Such modifications are also intended to fall within the scope of the appended claims.

Sample Preparation, Imaging, and Calculations

Samples were prepared for Examples 1-4 by depositing Ag onto the cleaved surface of commercially available $MoS_2$ in a vacuum chamber with a base pressure of $9 \times 10^{-11}$ mbar. Deposition occurred at room temperature using a 99.999% pure 2 mm Ag wire in a MANTIS QUAD-EV miniature electron-beam evaporator from Mantis Deposition Ltd. (Thame, Oxon. UK). A flux monitor was used to maintain a consistent deposition rate calculated to be approximately 0.1 Å/s from the resulting scanning tunneling microscopy ("STM") images. The error in determining nominal coverage from the STM images is estimated to be ±10%. Ag was deposited at coverages ranging from approximately 0.5 to 4.0 nm.

The samples were annealed using resistive heating and temperature was monitored using a type K thermocouple in contact with the preparation stage. Heating was performed at temperature for at least 10 minutes. This time was found to be sufficient for the surface to reach equilibrium by comparing surfaces annealed up to 12 hours.

Prepared samples were transferred in situ to the adjacent variable temperature STM head from Omicron (Uppsala, Sweden). STM tips were electrochemically etched from a 0.25 mm W wire in a 5 M potassium hydroxide solution with a 5 V DC bias or mechanically cut from a 0.25 mm $Pt_{90}Ir_{10}$ wire. Scanning parameters used in this study were relatively consistent. The tunneling bias typically ranged from 0.75 to 1.5 V and the current set point varied from 0.5 to 5 nA. No significant differences were observed between extremal scanning parameters.

Density functional theory ("DFT") was used to calculate the density of states ("DOS") of Ag(111). The crystal structure and lattice constants used in this calculation were derived from experimental results. An additional 1.5 nm vacuum spacing was added to the unit cell in the z direction to avoid wave function overlap. The Perdew-Burke-Ernzerhof implementation of the generalized gradient approximation ("PBE GGA") was used within the commercially available Atomistix Toolkit software package from QuantumWise (Copenhagen, Denmark). Convergence with respect to the k-point mesh was relatively slow, requiring a mesh of 70×70×1.

Cross sections from all images taken of Ag films revealed that the Ag forms atomically flat, plateaued islands that were stable for several weeks at base pressure. The Ag islands on all samples had a uniform distribution of heights as verified by a FWHM of typically less than 1.0 nm. These properties held true regardless of coverage or annealing temperature.

Example 1

In this Example, the effect of annealing on a shift in Ag island height was explored.

The samples used in this Example were prepared as described above with Ag deposition thickness, or nominal coverage, from 0.7 nm to 3.4 nm.

Figure 2:
FIG. 2 is a scanning tunneling microscopy image of Ag(111) islands on $MoS_2$ with a 0.7 nm nominal coverage after annealing at 575 K.
Figure 3:
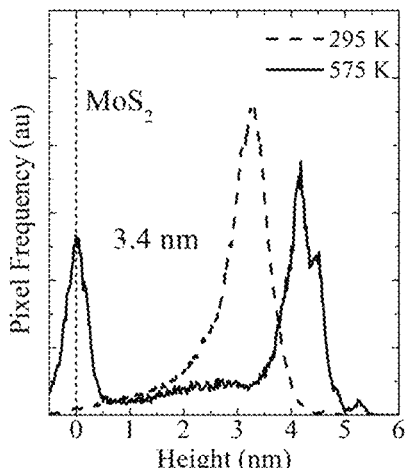
FIG. 3 is a plot of height distributions calculated from scanning tunneling microscopy images before and after annealing at 575 K. The dashed line indicates the location of the $MoS_2$ substrate.

Surfaces with coverage less than 2.5 nm consisted of small islands with faceted shapes reflecting the symmetry of the $MoS_2$ substrate as exemplified by the image from a 0.7 nm thick Ag film depicted in FIG. 1. The image in FIG. 2 shows this same surface after annealing to 575 K. The average lateral dimensions have clearly increased and nearly every island has assumed the shape of a regular hexagon. The preferred height of the Ag islands has also increased from about 1.40 nm to about 2.25 nm as demonstrated by the height distributions plotted in FIG. 3. The data from FIG. 3 was calculated from the images of FIG. 1 and FIG. 2. The estimated error in determining the preferred heights is ±0.24 nm, or one atomic layer of Ag(111).

Figure 4:
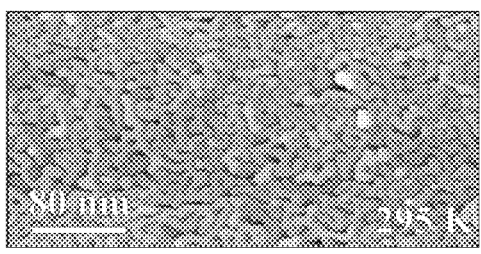
FIG. 4 is a scanning tunneling microscopy image of Ag(111) islands on $MoS_2$ with a 3.4 nm nominal coverage before annealing. This figure shares the same scale bar as FIG. 5.
Figure 5:
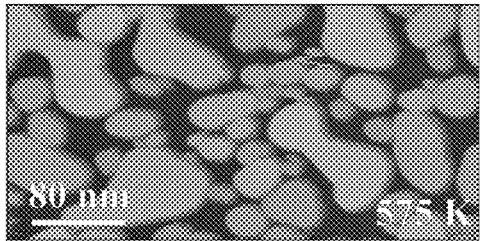
FIG. 5 is a scanning tunneling microscopy image of Ag(111) islands on $MoS_2$ with a 3.4 nm nominal coverage after annealing at 575 K.
Figure 6:
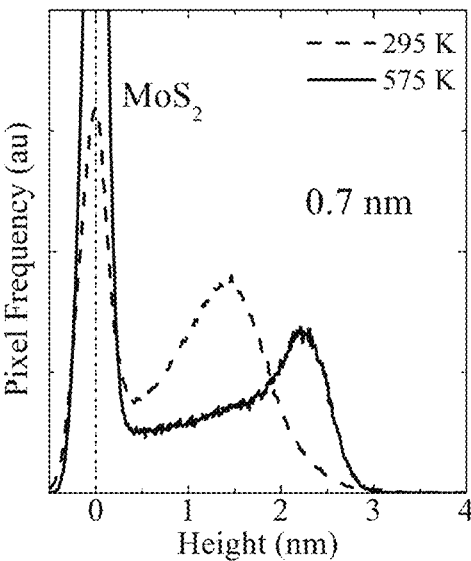
FIG. 6 is a plot of height distributions calculated from scanning tunneling microscopy images before and after annealing at 575 K. The dashed line indicates the location of the $MoS_2$ substrate.

Films with coverages greater than 2.5 nm were composed of irregular, elongated structures with no obvious correlation to the $MoS_2$ substrate. The image of a 3.4 nm thick film in FIG. 4 shows that these structures are not continuous but do cover nearly the entire substrate. In most cases, the absolute height of films thicker than 2.5 nm could not be determined before annealing because the substrate was not visible. After annealing to 575 K, a significantly larger portion of the $MoS_2$ is visible as shown in FIG. 5. The nearly continuous structures have transformed into a mixture of irregular and facetted islands. The preferred height of the Ag islands increased from about 3.25 to 4.15 nm when annealed as shown in FIG. 6. Two peaks can be seen in FIG. 6, the height difference of which corresponds to a single atomic Ag(111)

layer. A single atom step height was not unusual to find on the flat plateaus for this sample, indicating both heights have similar stability. The broad feature hump seen between 2 nm and 3 nm of FIG. 6 could be an artifact arising from an imperfect STM tip. Such artifacts can arise at intermediate heights in an STM image, therefore only the tallest features were included in the analysis.

Example 2

In this Example, the effect of annealing temperature on the shift in preferred island height was investigated.

Figure 7:
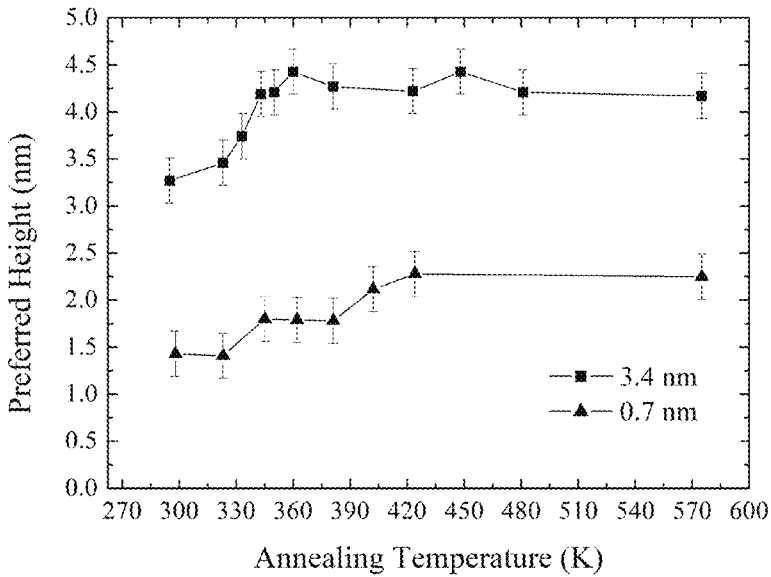
FIG. 7 shows a plot of preferred height of Ag(111) islands on $MoS_2$ as a function of annealing temperature for 0.7 nm and 3.4 nm thick samples.

The samples used in this Example were prepared as described above with Ag deposition thickness from 0.7 nm to 3.4 nm. The plot in FIG. 7 shows the shift in preferred island height of the 0.7 and 3.4 nm thick samples as a function of annealing temperature. In both cases, the preferred island height quickly increased before reaching an equilibrium state between approximately 350 K and 425 K, and in both cases was established by 500 K.

Example 3

In this Example, the effect of island size and height distributions for differing film thicknesses was explored.

Figure 8:
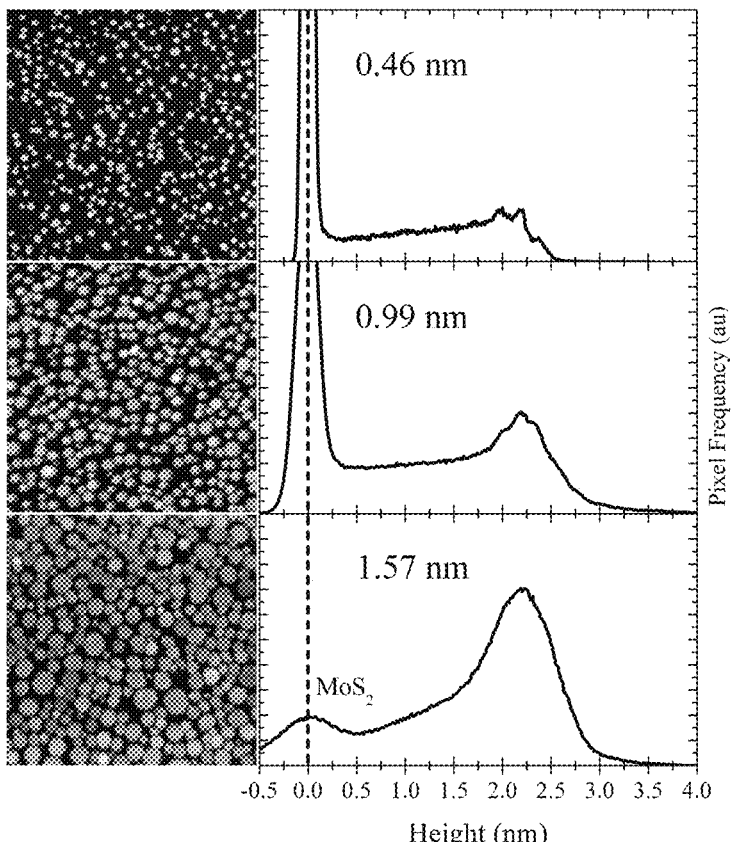
FIG. 8 shows scanning tunneling microscopy images, and corresponding plots of preferred height, of Ag(111) islands on $MoS_2$ for samples with three different Ag deposition thicknesses.

The samples used in this Example were prepared as described above with 0.46 nm, 0.99 nm, and 1.57 nm thick Ag films. FIG. 8 shows images and corresponding height distributions of fully annealed 0.46 nm, 0.99 nm, and 1.57 nm thick Ag films. The islands increase in lateral size with additional material. In contrast, the height distributions show the most probable island height stays consistent at about 2.25 nm, even as the amount of Ag is tripled.

Example 4

In this Example, preferred Ag island heights as a function of nominal Ag thickness was investigated.

Samples used in this Example were prepared as described above with varying nominal Ag film thickness.

Figure 9:
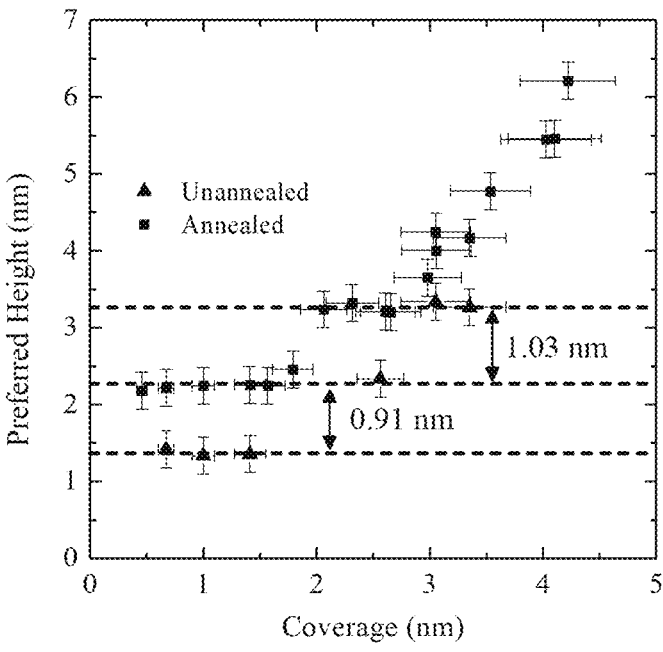
FIG. 9 is a plot of preferred island heights as a function of nominal Ag coverage on $MoS_2$ for annealed and unannealed samples. Horizontal dashed lines mark island heights exhibiting increased stability.

The coverage dependence of preferred island height is illustrated by FIG. 9. The preferred height of 2.25 nm is stable up to nominal coverages of 2.0 nm. As nominal coverages increase up to 3.0 nm, the next stable preferred height is at 3.3 nm. Above this, the preferred height is no longer stable, but instead increases with coverage. Unannealed preferred island heights are included in FIG. 9 indicated by the lighter grey triangles. Two of these preferred heights, at 2.25 nm and 3.3 nm, correspond to the stable features measured on the annealed samples. There is also an additional stable preferred height at 1.4 nm, which was only found before annealing. This height would appear to be metastable as it is not present at elevated temperatures.

In FIG. 9, dashed lines are used to indicate the average value of the stable heights calculated to be 1.38±0.05 nm, 2.29±0.09 nm, and 3.32±0.16 nm corresponding to 6, 10, and 14 atomic layers, respectively. The average spacing of these stable heights is 0.97 nm, roughly four atomic layers.

Example 5

In this Example, a substrate independent model for quantized metallic film growth was examined.

Figure 10:
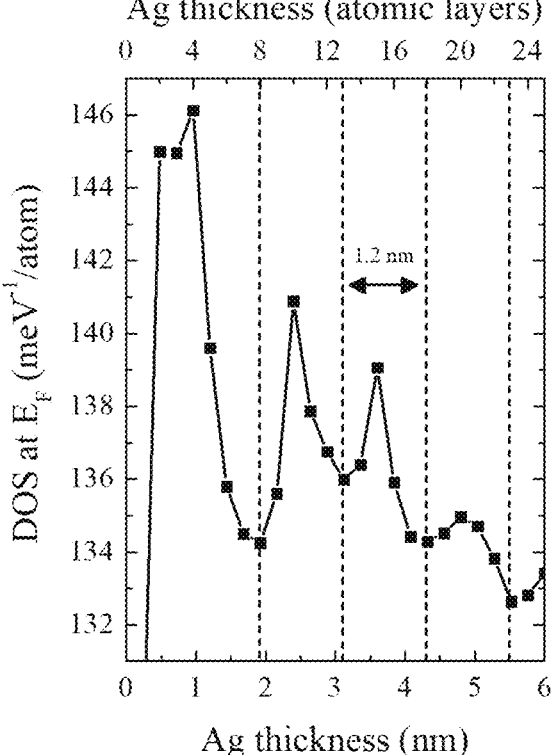
FIG. 10 is a plot of calculated density of states ("DOS") of freestanding Ag(111) slabs at the Fermi level as a function of Ag thickness.

As seen in FIG. 10, the DFT calculations show periodic dips in the DOS of Ag(111) at the Fermi level ("$E_F$") with an interval of 1.2 nm or five atomic layers. The periodicity of these stable energy configurations is in agreement with the experimental results. These calculations were carried out on freestanding slabs of Ag(111), suggesting minimal influence from the $MoS_2$.

The results indicate the physical and electronic structure are strongly coupled in ultrathin Ag(111) films. Confinement effects arising from quantization of perpendicular momentum influence the number states at $E_F$ and film stability. In the simplest model, only electrons with zero parallel momentum are considered when calculating quantum well states. This does not hold here as there are no states at the Fermi level in the [111] direction of Ag. However, perpendicular momentum can be quantized even if there is a nonzero parallel component. Systems with Fermi surface topologies that have parallel faces spanned by a nesting vector, q, are of particular interest. Introducing a periodicity associated with a nesting vector opens a gap in the DOS along the entire parallel face, disproportionally decreasing the electronic energy of the system. This is similar to the relationship between nesting vectors and the tendency toward charge density wave order in certain materials. Assuming conservation of parallel momentum, only nesting vectors normal to the surface are considered. Contributions to the DOS at $E_F$ are at a maximum when the island height, given as a discrete number of layers (N) with interlayer distance (d), are an integer multiple of $2\pi/q$, $$Nd = n\frac{2\pi}{q}. \tag{I}$$

Figure 11:
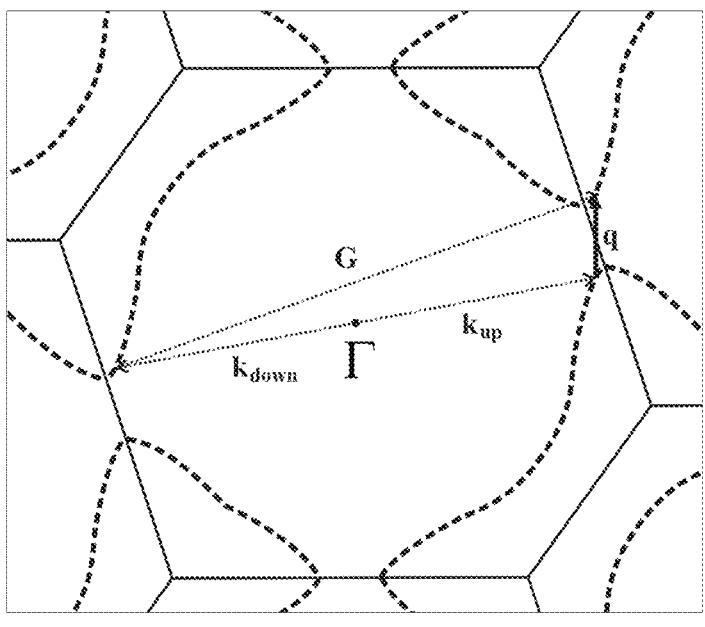
FIG. 11 illustrates a cross-section of the Fermi surface of Ag in the [111] direction perpendicular to the substrate. The nesting vector is labeled as "q" and spans the vectors "$k_1$" and "$k_2$" after translation back to the first Brillouin zone.

FIG. 11 illustrates the bulk Ag Fermi surface cut along the [111] direction. The nesting vector labeled here crosses into the second Brillouin zone and can be represented as spanning two points on the Fermi surface by momentum vectors $k_1$ and $k_2$ translated back into the first Brillouin zone by the reciprocal lattice vector, $q=k_1-(k_2+G)$. The corresponding periodicity of stable heights expected from this nesting vector is estimated to be approximately 1.3 nm according to Equation (I), within approximately one atomic layer of the experimental and computational results.

Example 6

In this Example, uniform, atomically flat Au film growth as a function of nominal Au thickness was investigated.

Figure 12:
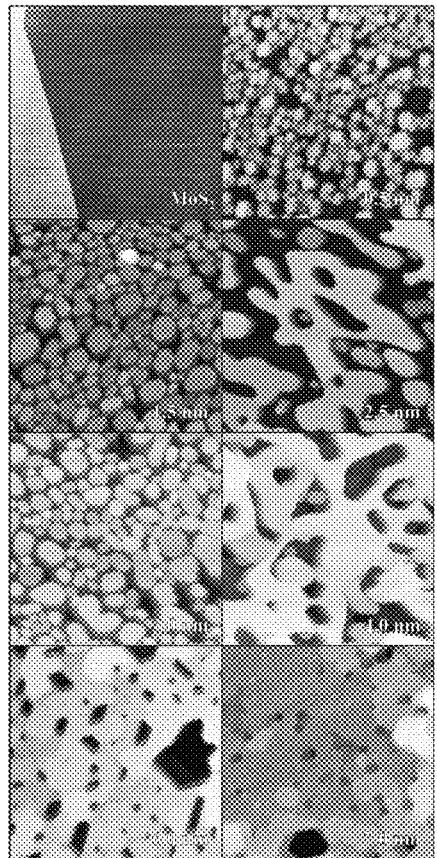
FIG. 12 shows scanning tunneling microscopy images of deposited Au on $MoS_2$ substrate with nominal film thicknesses of 0.5 nm, 1.5 nm, 2.5 nm, 3.4 nm, 4.0 nm. 6.0 nm, and 7.0 nm.

Samples were prepared using a $MoS_2$ substrate and Au was deposited upon the substrate according to the invention. STM images are shown in FIG. 12. Each square is 200 nm by 200 nm and is an image at a specific nominal Au thickness. The image denoted a) shows the $MoS_2$ substrate. The images labeled b) though h) are for nominal Au thickness of 0.5 nm, 1.5 nm, 2.5 nm, 3.0 nm, 4.0 nm, 6.0 nm, and 7.0 nm, respectively. These images indicate that the islands increase in lateral size with an increase in Au material, and as the layers reach a height of 7.0 nm, the surface loses the grains and becomes flat with occasional small divots.

Figure 13:
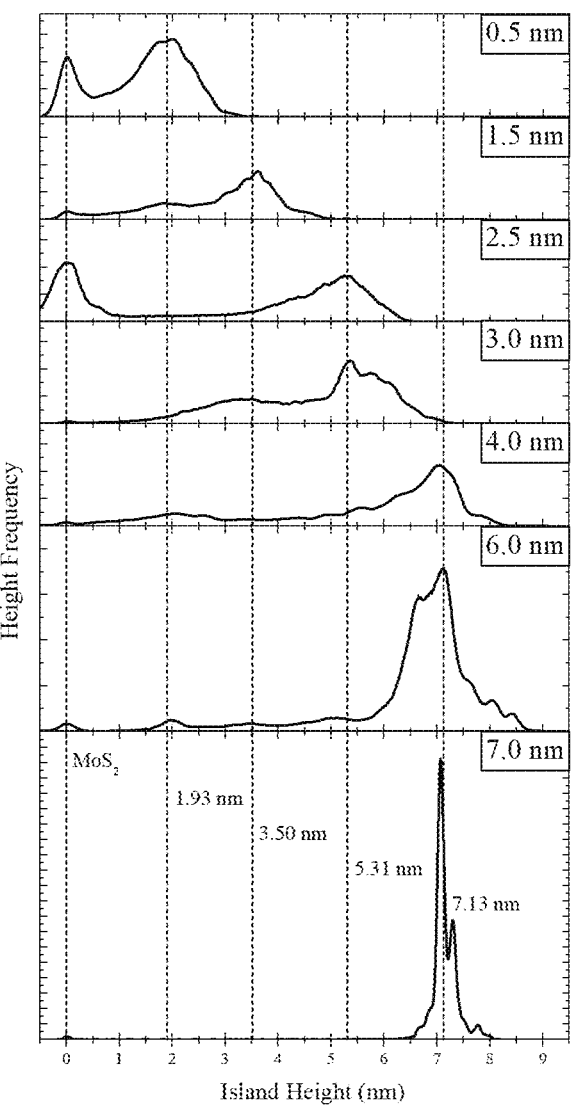
FIG. 13 shows plots of Au island heights for nominal film thicknesses of 0.5 nm, 1.5 nm, 2.5 nm, 3.0 nm, 4.0 nm. 6.0 nm, and 7.0 nm. Preferred island heights are indicated by the dashed lines.

FIG. 13 shows plots of Au island heights for each nominal thickness shown in FIG. 12. In FIG. 13, dashed lines are used to indicate the average value of the stable heights, or preferred island heights. Beginning at 4.0 nominal thickness, the preferred island height transitions to around 7 nm, and by 7 nm nominal Au thickness, there is a single sharp peak at about 7 nm indicating uniformity of the island height and the film itself.

Figure 14:
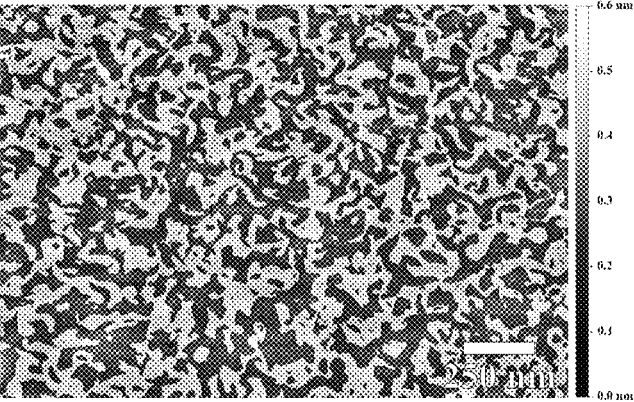
FIG. 14 shows a scanning tunneling microscopy image of a gold film having a thickness of about 8.5 nm on a $MoS_2$ substrate.
Figure 15A:
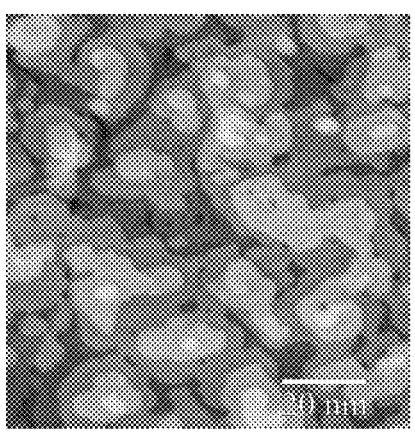
FIG. 15A shows a scanning tunneling microscopy image of a gold film on a $MoS_2$ substrate taken after room temperature deposition.
Figure 15B:
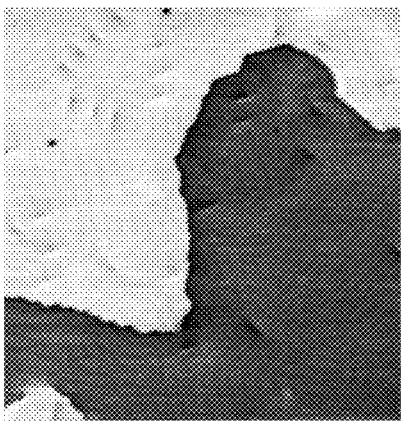
FIG. 15B shows a scanning tunneling microscopy image of the gold film shown in FIG. 15A taken after subsequent annealing to 700 K.
Figure 15C:
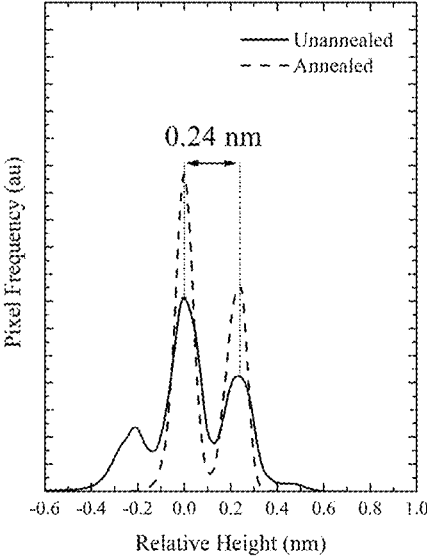
FIG. 15C shows a histogram of heights measured in the gold film samples taken after room temperature deposition and after subsequent annealing of FIGS. 15A and 15B.

FIG. 12 and FIG. 13 demonstrate that the Au films transform from isolated atomically flat nanostructures to a uniformly atomically flat film. The surface shows atomic scale flatness with film thickness deviating by no more than a single atom. The RMS of surface roughness is less than 50 pm, whereas one atom is about 250 pm. STM topography was taken from the Au covered $MoS_2$ with 8.5 nm coverage, which is shown in FIG. 14. FIGS. 15A-C show the STM measurements taken after room temperature deposition (FIG. 15A) and after subsequent annealing to 700 K (FIG. 15B). FIG. 15C provides a histogram of heights measured in the samples shown taken after room temperature deposition and after subsequent annealing, i.e., in FIGS. 15A and 15B but taking in a larger sample area.

Example 7

Figure 16:
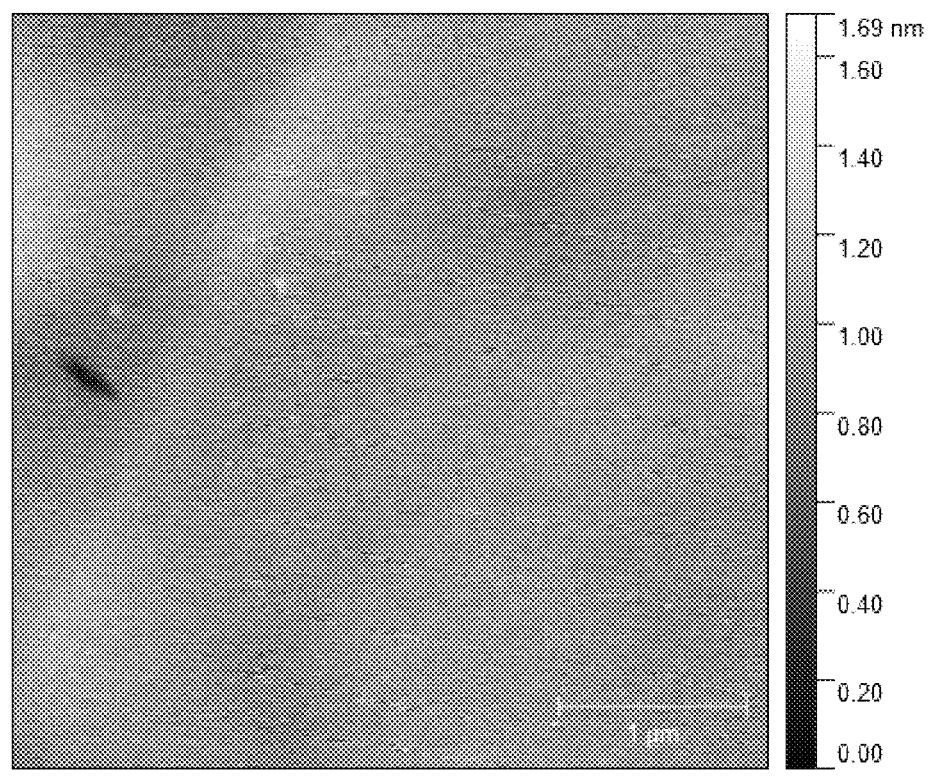
FIG. 16 is an atomic force microscopic image showing the topography of a single crystal $MoS_2$ surface covered with 10.1 nm of gold.

To evaluate and demonstrate the ability to manufacture the materials via sputtering. A gold film was deposited by direct current sputtering at 1 mTorr. onto a single crystal $MoS_2$ surface. Atomic force microscopy was performed to assess the surface flatness. The microscopy image is shown in FIG. 16, which shows the topography of single crystal $MoS_2$ surface covered with 10.1 nm of gold. The microscopy image (FIG. 16) shows a total of 16 square microns, with a total RMS surface roughness of 103 pm. The dark section (indicated by the white arrow) is a 0.6 nm depression, representing a small section missing the uppermost $MoS_2$ molecular layer. Small bright features (circled) represent small Au clusters with a height of 0.2 nm or 1 gold atom. There are no signs of grain structure. The film is, except as noted above a continuous and smooth film. The measurement precision of sample height is 100 pm (due to use of the atomic force microscopy), which limits the accuracy of our surface roughness measurements and implies the actual surface roughness is significantly lower.

While this invention may be embodied in many different forms, the described scientific papers and other referenced materials mentioned herein are incorporated by reference in their entirety. Furthermore, the invention encompasses any possible combination of some or all of the various embodiments mentioned herein, described herein and/or incorporated herein. In addition, the invention encompasses any possible combination that also specifically excludes any one or some of the various embodiments mentioned herein, described herein and/or incorporated herein.

The above disclosure is intended to be illustrative and not exhaustive. This description will suggest many variations and alternatives to one of ordinary skill in this art. All these alternatives and variations are intended to be included within the scope of the following claims where the term "comprising" means "including, but not limited to". Those familiar with the art may recognize other equivalents to the specific embodiments described herein which equivalents are also intended to be encompassed by the following claims.

What is claimed is:

1. A thin film composition comprising:
   a substrate and a metal, wherein the metal has a first side and a second side, wherein the first side is attached to the substrate forming an interface, wherein the interface is opposed to the second side, and wherein the second side is a continuous flat surface; wherein the continuous flat surface has a surface roughness of less than 200 pm as measured by scanning tunneling microscopy;
   wherein the substrate comprises $MoS_2$, and
   wherein the metal comprises gold and has a thickness of at least about 7.0 nm.

2. The thin film composition of claim 1, wherein the gold has a thickness between 7.0 nm and up to about 200 nm.

3. The thin film composition of claim 1, wherein the continuous flat surface has a surface roughness of less than about 100 pm as measured by scanning tunneling microscopy.

4. The thin film composition of claim 1, wherein the continuous flat surface is a reflective coating.

5. A method of preparing the thin metal film composition of claim 1 comprising:
   (a) depositing the gold on the $MoS_2$ substrate to form a thin metal film; wherein the depositing step is performed under vacuum conditions and at a temperature of at least about 0° C.; and
   (b) annealing the thin metal film; wherein the annealing is performed for a time between about 1 minute and about 20 hours; and wherein the annealing is performed at a temperature up to about 1000° C.

6. The method of claim 5, wherein the depositing step is performed by vacuum evaporation, sputtering, laser ablation, chemical vapor deposition, molecular beam epitaxy, or electroplating.

7. The method of claim 5, wherein the gold has a thickness between 7.0 nm and up to about 200 nm; and wherein the continuous surface has a surface roughness of less than about 100 pm.

* * * * *